United States Patent
Drake et al.

(10) Patent No.: US 11,228,404 B2
(45) Date of Patent: Jan. 18, 2022

(54) SYSTEMS, METHODS, AND STORAGE MEDIA FOR DETECTING A SECURITY INTRUSION OF A NETWORK DEVICE

(71) Applicant: Level 3 Communications, LLC, Broomfield, CO (US)

(72) Inventors: Steven E. Drake, Thornton, CO (US); Morgan M. Pofahl, Tulsa, OK (US)

(73) Assignee: Level 3 Communications, LLC, Broomfield, CO (US)

( * ) Notice: Subject to any disclaimer, the term of this patent is extended or adjusted under 35 U.S.C. 154(b) by 86 days.

(21) Appl. No.: 16/582,943

(22) Filed: Sep. 25, 2019

(65) Prior Publication Data

US 2020/0106572 A1  Apr. 2, 2020

Related U.S. Application Data

(60) Provisional application No. 62/738,808, filed on Sep. 28, 2018.

(51) Int. Cl.
| | |
|---|---|
| *H04L 1/24* | (2006.01) |
| *H04J 3/14* | (2006.01) |
| *H04B 10/035* | (2013.01) |
| *G01R 31/317* | (2006.01) |

(52) U.S. Cl.
CPC ........ *H04L 1/243* (2013.01); *G01R 31/31716* (2013.01); *H04B 10/035* (2013.01); *H04J 3/14* (2013.01)

(58) Field of Classification Search
CPC .......... H04L 1/243; H04J 3/14; H04B 10/035; H04B 10/85; G01R 31/31716
See application file for complete search history.

(56) References Cited

U.S. PATENT DOCUMENTS

| | | | | |
|---|---|---|---|---|
| 2008/0122579 | A1* | 5/2008 | German | H04Q 1/138 340/10.1 |
| 2012/0328239 | A1* | 12/2012 | Fuerst | H04J 14/0258 385/20 |
| 2016/0099851 | A1* | 4/2016 | Archambault | H04J 14/0212 398/16 |
| 2016/0204856 | A1* | 7/2016 | Yin | H04B 10/0795 398/5 |
| 2016/0308608 | A1* | 10/2016 | Ejima | H04J 14/0212 |
| 2018/0076919 | A1* | 3/2018 | Yilmaz | H04J 14/0212 |

* cited by examiner

*Primary Examiner* — Sharmin Chowdhury

(57) ABSTRACT

Systems, methods, and storage media for detecting a security intrusion of a network device are disclosed. Exemplary implementations may include a method involving, in the network device including a processor, monitor a light signal associated with a security enabled port of the network device; and in response to detecting a change in the light signal, initiate a security alert.

18 Claims, 7 Drawing Sheets

SYSTEMS, METHODS, AND STORAGE MEDIA FOR DETECTING A SECURITY INTRUSION OF A NETWORK DEVICE

CROSS-REFERENCE TO RELATED APPLICATION

This application is related to and claims priority under 35 U.S.C. § 119(e) from U.S. Patent Application No. 62/738,808, filed Sep. 28, 2018 entitled "SYSTEMS, METHODS, AND STORAGE MEDIA FOR DETECTING A SECURITY INTRUSION OF A NETWORK DEVICE," the entire contents of which is incorporated herein by reference for all purposes.

FIELD OF THE DISCLOSURE

Aspects of the present disclosure relate to systems, methods, and storage media for managing a telecommunications network, and more particularly to detecting a security intrusion of a network device of a telecommunications network.

BACKGROUND

Fiber-optic communication involves transmitting information between devices by sending light waves through an optical fiber. Fiber-optic communication systems have revolutionized the telecommunications industry and have played a major role in the evolution of the Internet and the sharing and transmitting of data in general. With numerous advantages over electrical transmission, optical fiber-based communications are replacing copper wire based communications in networks throughout the world.

Wavelength-division multiplexing (WDM) is a technology that combines, or multiplexes, optical carrier signals on a single optical fiber using different wavelengths (colors) of light. Stated differently, data is not only encoded into a wave of light but also into discrete wavelengths. With WDM, the capacity of an optical network can be dramatically increased as each fiber can carry many different wavelengths of light. WDM technology allows a network to combine optical signals for many uses, particularly in transmitting signals from one node of the network to another.

Many optical networks, particularly long-haul (i.e., those networks covering vast distances) and metro networks, include devices or services that include WDM features to combine optical signals on a fiber cable. Such devices may include Fixed Optical Add-Drop Multiplexer (FOADM) or Reconfigurable Optical Add-Drop Multiplexer (ROADM) devices. Generally speaking, a FOADM device provides multiplexing of input optical signals onto a common output and a ROADM device allows switching among the inputs to the device to generate the multiplexed output signal. With the ROADM device, a particular wavelength of light can be identified and switched between fibers, or otherwise added or removed from a multiplexed wave bundle, without converting the optical signal to an electrical signal.

The operation and configuration of a ROADM device, as well as other networking devices, may be vulnerable to security breaches in which the traffic transmitted on the ROADM device may be intercepted. In particular, a typical ROADM device may include one or more unused ports through which traffic may be obtained when nefarious equipment is connected to the unused ports. For example, in some cases, input signals into a ROADM may be replicated on one or more unused output ports, opening up the possibility that traffic capturing equipment may be plugged into or otherwise connected to the unused port to obtain the replicated traffic. This security vulnerability of the traffic on the network may be exploited to unlawfully monitor and store the network traffic.

SUMMARY

One aspect of the present disclosure relates to a network security device comprising a plurality of bi-directional communication ports each comprising an output port and a corresponding input port, a loopback connector to redirect a light signal from an output port of at least one of the plurality of bi-directional communication ports to a corresponding input port of the at least one of the plurality of bi-directional communication ports, and a controller configuring the at least one of the plurality of bi-directional communication ports as a security enabled port. The controller may further transmit an alarm indication in response to detecting a loss of the redirected light signal on the at least one of the plurality of bi-directional communication ports Another aspect of the present disclosure relates to a method for detecting a security intrusion of a network device. The method may include redirecting, at a networking device, a light signal present an output portion of a bi-directional communication port of the networking device to a corresponding input portion of the communication port, monitoring, via a controller, a presence of the light signal on the input portion of the communication port, and transmitting, via the controller, a security alarm in response to detecting a loss of light signal on the input portion of the communication port.

Yet another aspect of the present disclosure relates to a network device. The network device may include a network communication port receiving a telecommunications signal, a wavelength selectable switch (WSS) replicating the telecommunications signal on a plurality of bi-directional communication ports each comprising an output port and a corresponding input port, and a loopback connector to redirect a light signal from an output port of at least one port of the plurality of bi-directional communication ports to a corresponding input port of the at least one port. The network device may further include a photodetector associated with the at least one port to detect a light signal on the input port of the at least one port and a controller receiving a light detection signal from the photodetector and generating, based on the light detection signal, a security alarm for the at least one port.

These and other features, and characteristics of the present technology, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of 'a', 'an', and 'the' include plural referents unless the context clearly dictates otherwise.

DETAILED DESCRIPTION

Aspects of the present disclosure involve a networking device configured to detect a security intrusion at a port of the device and to provide an indication of the detection of security intrusion to a central alarm system. In one example, the networking device may include one or more input/output (or bi-directional) ports for communications with other components of the networking device. The bi-directional ports may include a photodetector, such as a photodiode, to detect light signals being received on the port. When the port is not connected, no light is received at the port and the photodetector will subsequently not detect light on the port. The photodetector may be in communication with a controller such that indicator signals of the presence of light on the port may be transmitted to the controller. The controller may be configured to generate an alarm condition in response to the indication signals received from the photodetectors, as described in more detail below.

In some instances, an input signal of network traffic may be received at a common input of the networking device. The common input signal may be demultiplexed or copied onto one or more of the bi-directional ports for connection to other networking devices or other components of the networking device. In some instances, however, the demultiplexed signal on the input/output ports may be intercepted by a network capture device. To prevent the connection of a network capture device on the ports, a loopback connector may be coupled with an otherwise empty port causing the light of the common input signal to be redirected back to the port and detected by the photodetector. The controller of the networking device may configure a state for each unused port to monitor for the presence of the light on the port based on the signals received from the photodetectors. In the circumstance that a feedback loop is removed from a port and the feedback signal is lost (possibly to insert a network capture device into the port), the controller may generate an alarm signal based on the indication of the lost signal. In some instances, the alarm condition (as well as information identifying the port associated with the alarm) may be transmitted to an alarm system for processing. In this manner, the networking device may be configured to detect the potential connection of a network capture device (or other nefarious networking device) to an unused port of the networking device and provide an alarm to a monitoring system for verification of the loss of signal and to mitigate any security breaches associated with the networking device.

Figure 1:
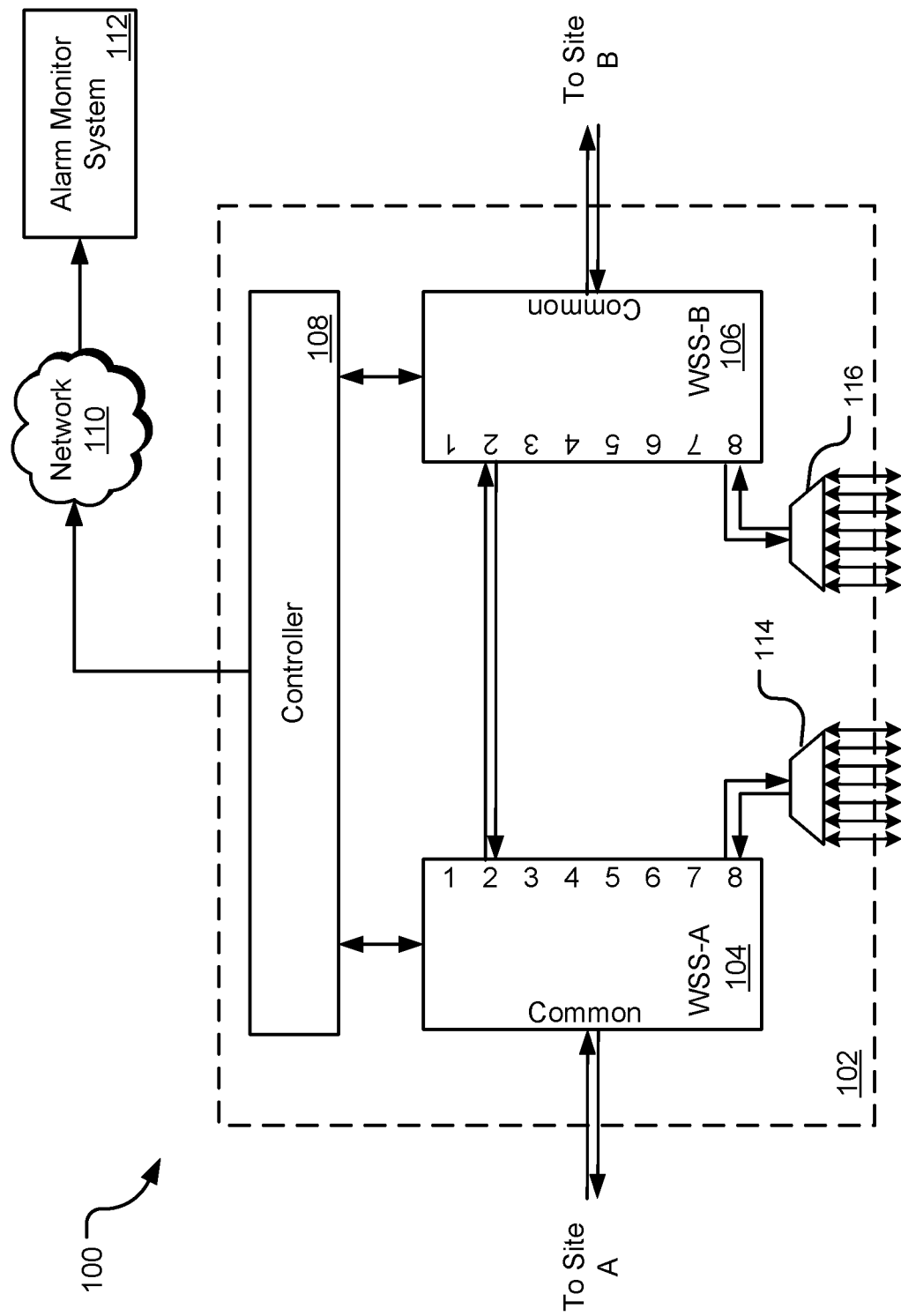
FIG. 1 is a schematic diagram illustrating an exemplary network system for optical multiplexing connected to a security monitoring system, in accordance with one or more implementations.

FIG. 1 is a schematic diagram illustrating an exemplary network system for optical multiplexing connected to a security monitoring system, in accordance with one or more implementations. The system 100 includes a networking device 102, in particular a Reconfigurable Optical Add-Drop Multiplexer (ROADM) device 102 used to multiplex optical signals onto a common output in which switching among multiple input signals is provided to generate the multiplexed output signal. However, it should be appreciated that other networking devices may also be included in the system 100 for which the devices, methods, and systems described herein may apply.

As described, the ROADM device 102 provides for switching in incoming optical signal among multiple output or transmission paths. For example, a ROADM 102 may receive an optical signal from a source, such as Site A. The ROADM 102 provides for redirecting of the signal to any number of alternate sites in communication with the ROADM 102, such as Site B. The number of alternate sites or transmission paths available to the ROADM 102 to switch to may be referred to as the device's degrees of freedom. Thus, a ROADM 102 with four possible output paths may include four degrees of freedom for transmission of a received optical signal. In addition, portions of the optical signal may be demultiplexed from the input signal and provided to other circuits or customers of a network. This may be referred to as "dropping" portions of the signal from the multiplexed optical signal.

In FIG. 1, only a portion of the ROADM device 102 is illustrated for simplicity. In particular, the ROADM 102 of FIG. 1 illustrates a first wavelength selectable switch (WSS) 104 portion of a ROADM in communication with a second WSS portion 106 of a ROADM 102. Each WSS 104, 106 provide for the multiplexing, switching, demultiplexing, dropping, and the like of an incoming optical signal. A ROADM 102 may include several WSS modules, although only two are illustrated in FIG. 1. The illustrated two WSS modules of the ROADM 102 therefore provide the ROADM with two degrees of freedom, meaning that the ROADM 102 may be configured to provide an incoming optical signal to another site or back to the origination site. Additional WSS modules increase in the degrees of freedom of the ROADM 102 by providing additional transmission paths for an incoming optical signal.

In this example, the ROADM 102 is configured to interconnect Site A and Site B such that an optical signal may be transmitted between the two sites via the ROADM 102 device. The WSS components 104, 106 of the ROADM 102 illustrated are 8×1 wavelength selectable switches, as they multiplex or demultiplex a signal between one bi-directional port (referred to as a "common" port) and 8 bi-directional ports (referred to as the "output" ports). The two WSS 104, 106 may be part of the same or separate ROADM devices 102. Additional WSS 104, 106 may be included in a ROADM 102 to increase the degrees of freedom of the ROADM 102 device. Also, other types of WSS 104, 106 may be incorporated in the ROADM 102, such as 4×1, 16×1, 8×2, WSS components, and so forth.

As shown, WSS-A 104 includes a common port connected to Site A such that an optical signal may be received or transmitted to Site A from WSS-A 104. Similarly, WSS-B 106 includes a common port connected to Site B such that an optical signal may be received or transmitted to Site B from WSS-B 106. Within the ROADM 102, each WSS 104, 106 provides a copy of the signals received on the common port to the eight output ports of the respective WSS 104, 106. It is noted that each of the output ports of the WSS 104, 106 are bi-directional such that the term "output port" is used for convenience herein. For example, WSS-A 104 may receive an input signal from Site A on the common port and provides (through a demultiplexer described below) the received common signal to each of the eight output ports of the WSS-A 104. The output ports of each of the WSS 104, 106 provide for interconnection with other WSS of the ROADM 102 or to drop portions of the optical signal to other circuits or networks. In the example illustrated in FIG. 1, WSS-A 104 and WSS-B 106 are interconnected over port 2 of each WSS. Further, port 8 of each WSS 104, 106 is utilized to drop out the optical signal through demultiplexers 114, 116. Although illustrated as connecting across port 2, port 2 of WSS-A 104 may connect to any port of WSS-B 106 to interconnect the WSS components 104, 106. Further, the dropped signal may be output from any port of the WSS 104, 106. Further still, other WSS of the ROADM 102 may connect to the unused ports of the WSS 104, 106 illustrated to increase the degrees of freedom of the ROADM 102.

In the example shown, WSS-B 106 may receive the optical signal from WSS-A 104 via port 2 and provide the optical signal on the common output port to Site B. In the circumstance in which other WSS are connected to WSS-B 106 via one or more of the unused ports, WSS-B 106 may combine or multiplex signals from each of the connected ports through a switching mechanism. The example illustrated in FIG. 1 provides for the an optical signal received from Site A at the ROADM 102 to be output on port 2 of WSS-A 104 to port 2 of WSS-B 106 and output to Site B. In a similar manner, an optical signal from Site B may be transmitted to Site A along the same path in the opposite direction. Portions of the optical signals may be dropped to other circuits or networks in addition to being transmitted to other sites.

The ROADM 102 may also include a controller 108 in communication with the WSS 104, 106 of the ROADM 102. In some instances, the controller 108 may configure one or more aspects of the WSS 104, 106, such as assigning an operational state to one or more ports of the WSS, controlling the switching and/or multiplexing functions of the WSS 104, 106, receiving operational information from the WSS 104, 106, and the like. In some instances, signals received from the WSS 104, 106 may cause the controller 108 to generate an alarm condition or state. The controller 108 may, in some instances, transmit an alarm to an alarm monitor system 112 via a network 110. The transmitted alarm may be based on a detected loss of light at a port of a WSS 104, 106 of the ROADM 102 and may indicate a potential security breach at the ROADM 102. The transmission of the alarm condition to the alarm monitoring system 112 may also initiate one or more responses or procedures to determine the extent of the detected security breach at the ROADM 102. The operations, algorithms, and functions of the controller 108 are described in more detail below.

Figure 2:
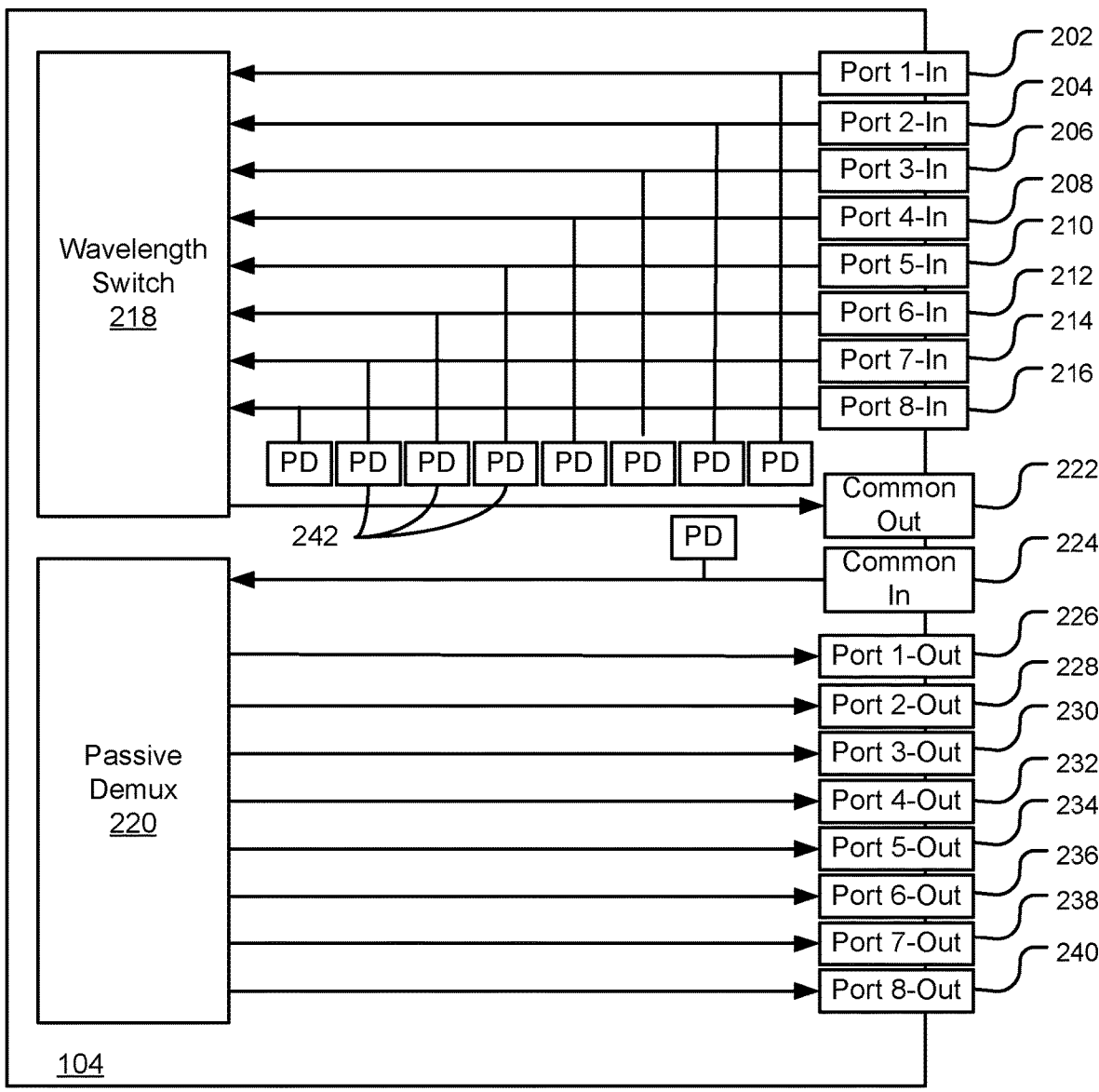
FIG. 2 is a schematic diagram illustrating an exemplary networking device for multiplexing optical signals, in accordance with one or more implementations.

FIG. 2 is a schematic diagram illustrating an exemplary networking device 104 for multiplexing optical signals, in accordance with one or more implementations. In particular, the networking device 104 of FIG. 2 is a schematic illustration of a WSS 104 of the ROADM 102 discussed above in relation to FIG. 1. Although described in relation to the WSS-A 104 of FIG. 1, WSS-B 106 or other WSS components of a ROADM 102 may include a similar composition or design. The systems, methods, and devices discussed herein to provide a security feature to a ROADM 102 or other networking device may also apply to other devices or components. Rather, the design of FIG. 2 is provided here as an example component to which one or more of the features described herein may apply.

As described, the WSS 104 may include a common port and 8 output ports, although more or fewer common ports and/or output ports may be included in other versions of the WSS. Each port, including the common port, includes an input portion and an output portion such that each port is a bi-directional port. Although the input and output portions of the ports are illustrated separately in FIG. 2, each port may include a single interface over which both input and output signals are transmitted. Each of ports 1-8 of the WSS-A 104 of FIG. 1 thus are illustrated as an input portion and an output portion in FIG. 2. For example, port 1 of WSS-A 104 includes input port 202 and output port 226. In input port 202-216 may be connected to a wavelength switch 218 that is configured to multiplex input signals from the input ports 202-216 into a common, multiplexed output signal as described above. Thus, wavelength switch 218 may transmit the multiplexed output signal to common output port 222 for transmission to another site or node of a network (such as to Site B of FIG. 1). Wavelength switch 218 may also switch between signals on input ports 202-216 to generate the switched multiplexed optical output signal as described.

The common input port 224 may receive an optical signal from a site or node of the network (such as Site A of FIG. 1) and provide the common input signal to a passive demultiplexer 220 component. The demultiplexer 220 duplicates the common input signal on common input port 224 and provides the duplicated signal to output port 1-8 226-240. Thus, each output port 226-240 receives and provides the same signal corresponding to the common input signal. However, one or more of the output ports 226-240 may remain unused when installed or instantiated in a network. Utilizing FIGS. 1 and 2 as an example, WSS-A 104 receives a common input signal at common input port 224 from Site A. Passive demultiplexer 220 of WSS-A 104 duplicates the input signal and provides the signal to each output port 226-240. Output port 2 228 of WSS-A 104 is connected to input port 2 204 of WSS-B 106 such that the input signal provided to WSS-A 104 is transmitted out of port 2 228 into corresponding port 2 204 of WSS-B106. Upon transmission via input port 2 204, the signal is received at wavelength switch 218 of WSS-B 106 and provided to common output port 222 for transmission to Site B. In this manner, signals received at the common input port of the WSS 104 may be transmitted or switched to other WSS components or sites via the communications ports of the WSS.

A photodetector 242 or other light detecting sensor may be connected to each of the input ports 202-216 of the ROADM device 102. In general, a photodetector 242 detects the presence of light on the corresponding input port 202-216 and provides an indication signal of the measurement of light on the input. In some instances, the photodetector 242 may measure the intensity of the light present on the input port 202-216, while other photodetectors 242 provide an on or off indication. Although not illustrated in FIG. 2, each of the photodetectors 242 may be in communication with controller 108 to provide the indication signal to the controller 108. As described in more detail below, the controller 108 may determine which of the input ports 202-216 has a light signal present at the port. The common input port 224 may also include a photodetector 242 to detect the presence of a light signal on the common input port 224.

Figure 3:
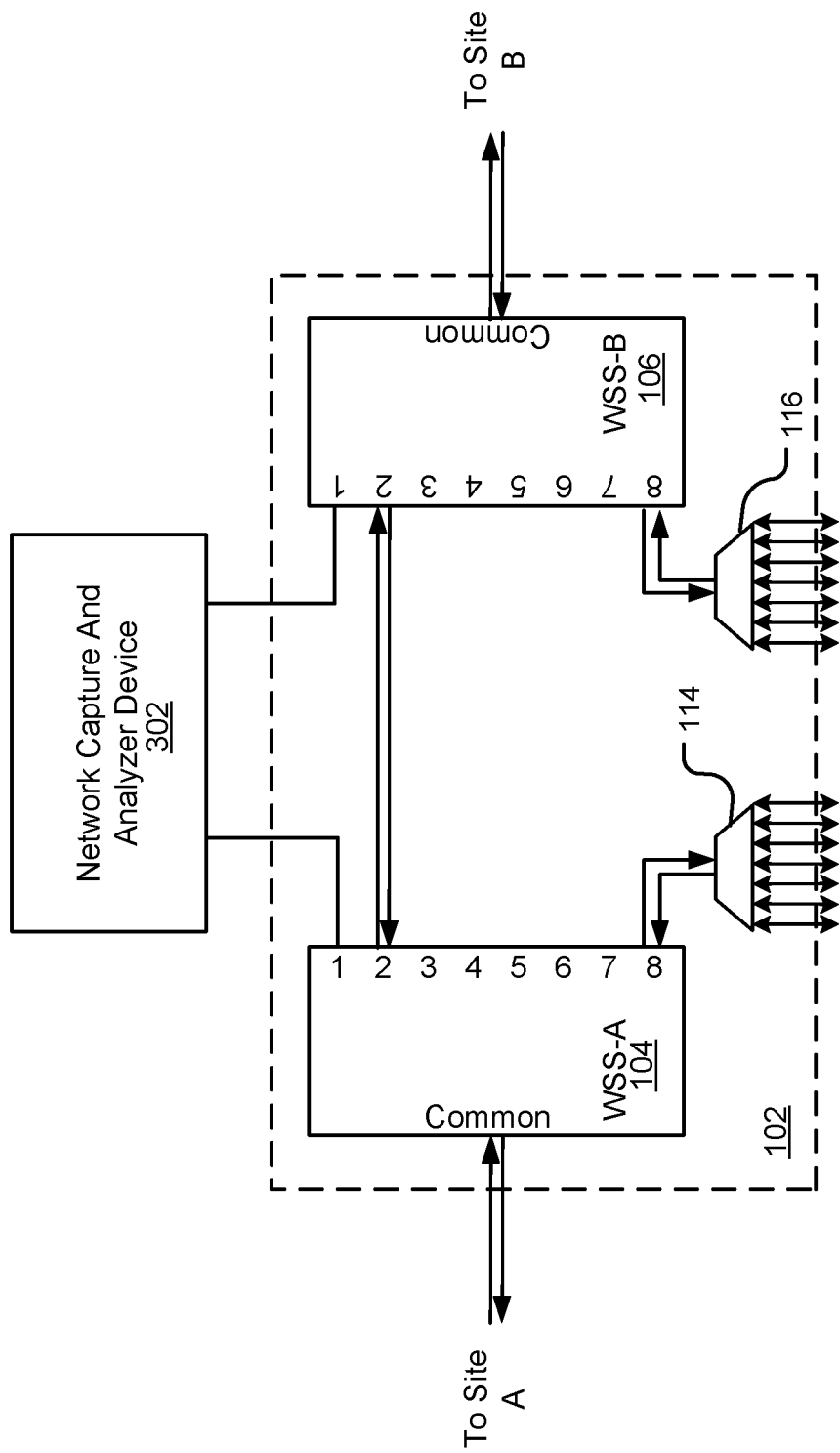
FIG. 3 is a schematic diagram illustrating a compromised networking device, in accordance with one or more implementations.

As further illustrated in the system 100 of FIG. 1, one or more of the ports of the WSS 104, 106 of the ROADM 102 may be unused. For example, port 1 and ports 3-7 of both WSS 104, 106 of the ROADM 102 are unconnected to other WSS, components of the ROADM, networks, etc. These unused or open ports provide a potential security flaw for network traffic carried by the ROADM 102. For example, FIG. 3 is a schematic diagram illustrating a compromised networking device 102, in accordance with one or more implementations. The networking device 102 may be the same ROADM as discussed above that includes WSS-A 104 and WSS-B 106 connected across port 2 of the respective WSS. In this illustration, however, a network capture and analyzer device 302 is connected to port 1 of WSS-A 104 and port 1 of WSS-B 106. As discussed above in relation to FIG. 2, the common input signal provided to common input port 224 is replicated to each output port 226-240. A network analyzer 302 connected to an unused port of the WSS 104, 106 of the ROADM 102 may therefore receive the common input signal provided on the common input port 224. By connecting the network analyzer 302 to one port of each of the WSS 104, 106 of the ROADM 102, all traffic signals into the ROADM 102 may be obtained, analyzed, and/or stored. A bad actor attempting to capture all or some of the data of the network may therefore connect a capture device 302 to the ports of a ROADM 102 to steal the network information.

Figure 4:
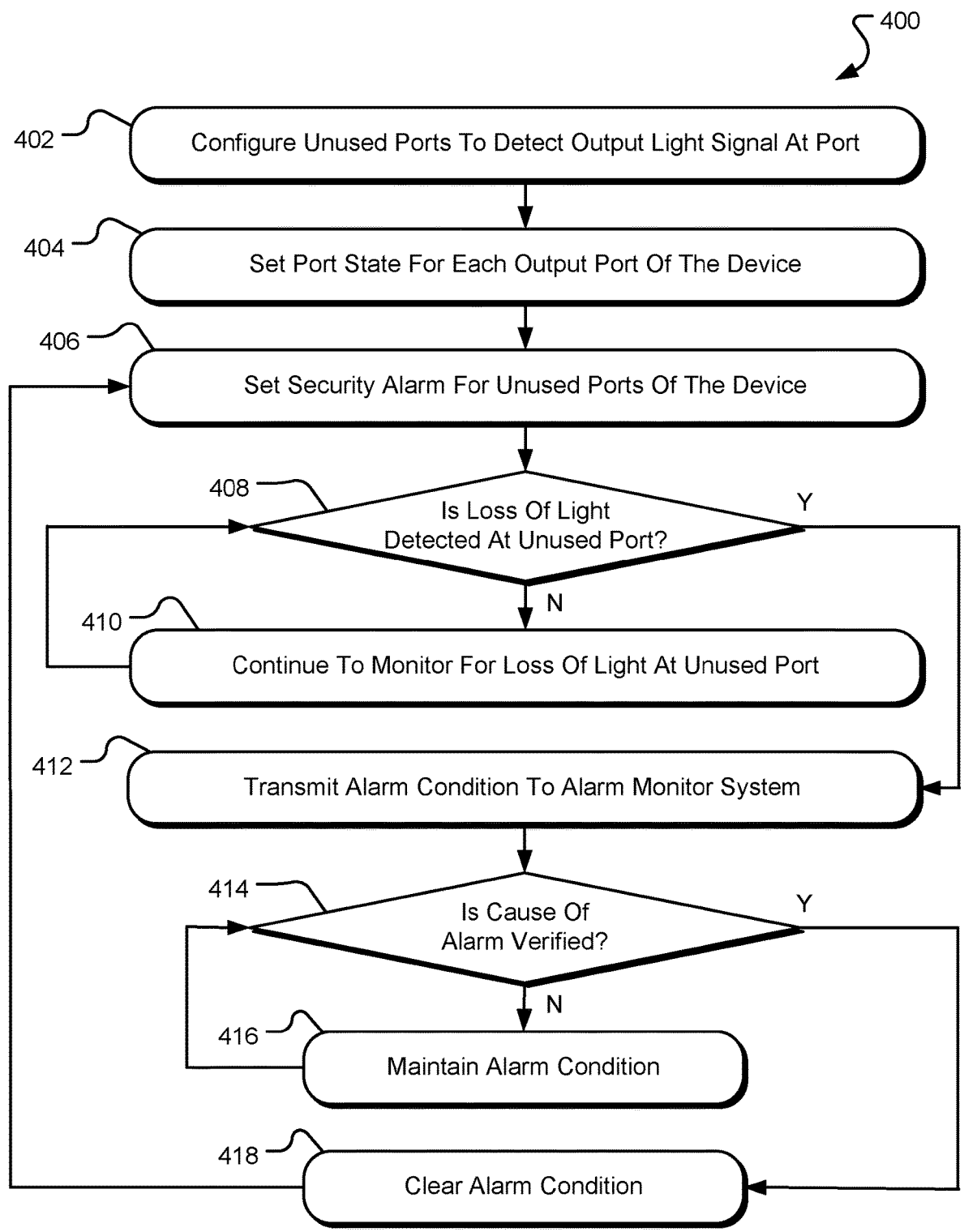
FIG. 4 illustrates a method for detecting a security intrusion of a network device, in accordance with one or more implementations.
Figure 5:
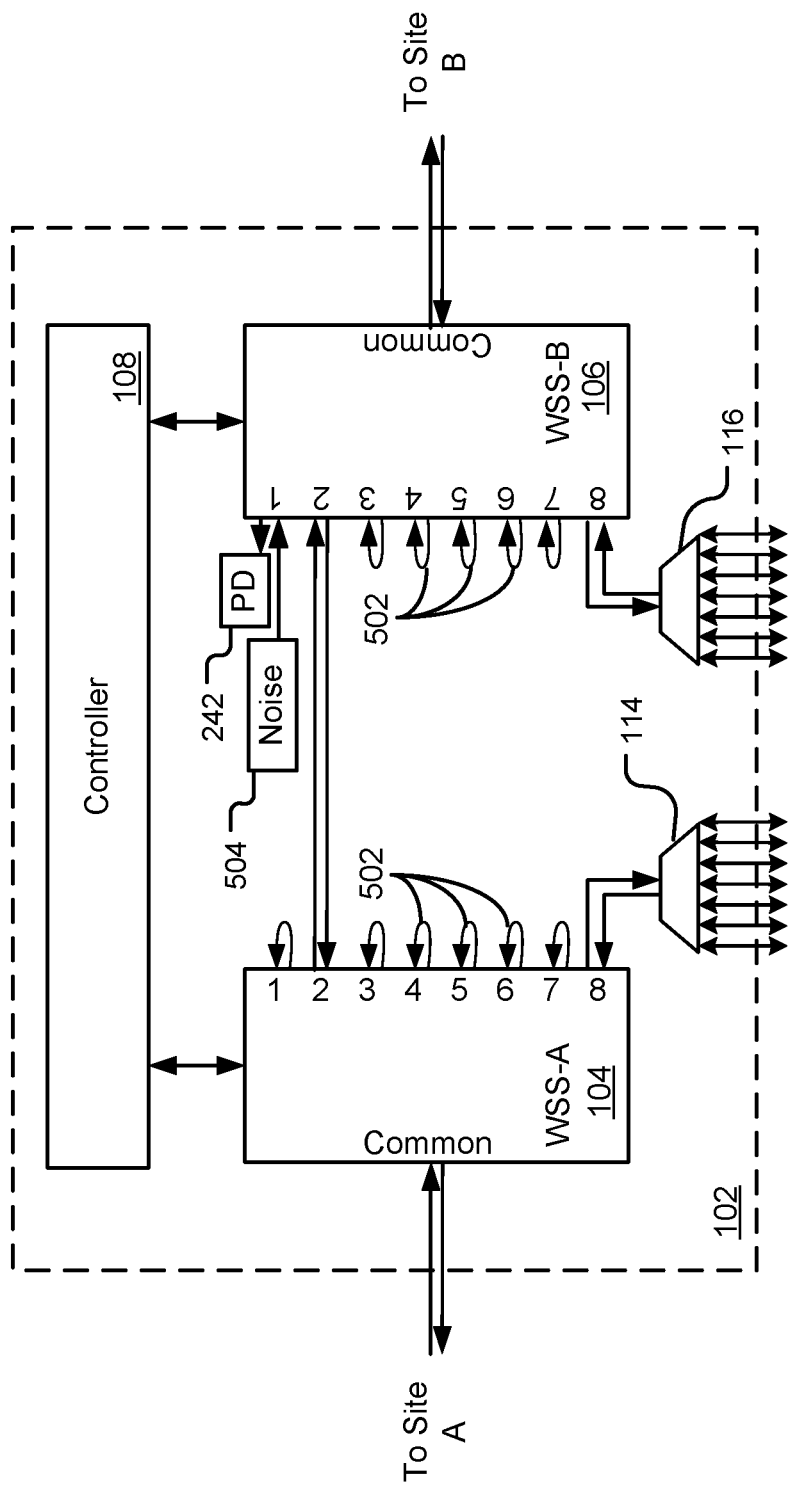
FIG. 5 is a schematic diagram illustrating an exemplary secured configuration of a network device, in accordance with one or more implementations.

FIG. 4 illustrates a method 400 for detecting a security intrusion of a network device 102, in accordance with one or more implementations. One or more of the operations may be performed by components of the ROADM device 102, such as controller 108. In addition, one or more of the operations may be performed by software programs, hardware components, or a combination of hardware and software components of the networking device 102. Beginning in operation 502, one or more of the unused ports of WSS 104, 106 of the ROADM 102 may be configured to detect an output at the port. For example, FIG. 5 is a schematic diagram illustrating an exemplary secured configuration of a network device 102, in accordance with one or more implementations. The network device 102 of FIG. 5 is a similar ROADM device as described above with WSS-A 104 interconnected with WSS-B 106 over port 2. However, in the embodiment illustrated, each unused port for WSS-A 104 and WSS-B 106 includes a loopback 502 that connects the output port of each port to the corresponding input portion of the port. More particularly, a loopback circuit 502 may be inserted or connected to ports 1 and 3-7 of WSS-A 104 and WSS-B 106 as those ports are unused by the ROADM 102. The loopback circuits 502 connect the output portion of the respective ports (such as Port 1—Out 226 of the WSS 104 of FIG. 2) to the corresponding input portion of the same port (such as Port 1—In 202 of FIG. 2). The loopbacks 502 thus providing any signal present on the output portion of the port to the input portion of the port. The loopbacks 502 may be physical connections or software connections configured to feedback the signal on the output portion of the port to the input portion of the same port. In one instance, the controller 108 may configure a software interconnect to form the loopback 502. In another example, the loopback 502 may be a physical device that is inserted into the port to feedback the signal.

Returning to the method 400 of FIG. 4, the controller 108 may configure a port state for each of the ports of the WSS 104, 106 of the ROADM 102 device. For example, a function of each port may be identified and stored by the controller 108 based on the configuration of the ROADM 102. Such port states may include an unused or unconnected state, an interconnection state (for ports that interconnect to other WSS components of the ROADM 102), a traffic drop state (for ports from which one or more portions of the optical signal are dropped to other circuits), and the like. The controller 108 in the example figures may thus state a "interconnect" state for port 2 of WSS-A 104 and port 2 of WSS-B 106, a "drop traffic" state for port 8 of the WSS 104, 106, and an "unconnected state" for ports 1 and 3-7 for the WSS 104, 106. In some instances, the controller 108 may assign or associated a "used/connected" state or an "unused/unconnected" state to the ports of the WSS 104, 106.

In operation 406, the controller 108 may set or associate a security alarm procedure for ports of the WSS 104, 106 designated as unused or unconnected. In general, the alarm procedure monitors for a loss of light at the port and initiates an alarm condition when a loss of light is detected. For example and as discussed above with reference to FIG. 2, the common input signal is duplicated and provided to the output portion of each port 226-240 of the WSS 104 such that the common input signal is available from any port 226-240 of the component. The feedback loops 502 provide the common input signal on each output port 226-240 back to the input portion of the respective ports 202-216. The associated photodetector 242 connected to the input portion of each port 202-216 may then detect that a light signal is present at the input port 202-216. As each photodetector 242 provides an indication signal to the controller 108 as to the presence or loss of light at the respective port 202-216, the controller 108 may determine the presence of the common input signal being received at each of the unused input ports 206-218.

Returning to operation 406, the alarm procedure associated with the unused ports of the WSS 104, 106 may comprise generating an alarm condition for the port when a loss of light is detected at the port by the corresponding photodetector 242. Upon detection of a loss of a light signal at the port, the controller 108 may generate an alarm condition for the port. In addition to setting the alarm condition for the port, the controller 108 may transmit an indication of the alarm condition for the port to the alarm monitoring system 112, as described in more detail below.

With a security alarm procedure associated with the unused ports, the controller 108 may begin monitoring the ports for a loss of signal. In operation 408, the controller 108 may determine if a loss of a light signal at any of the unused ports is detected, based on the indication signals provided by the photodetectors 242 of the WSS 104, 106. A loss of light at an unused port may occur when a loopback 502 is removed from a port, perhaps to insert a network capture device 302 into a port of the WSS 104, 106. If no loss of light at the port is detected, the controller 108 may continue to monitor for the loss of light in operation 410 and determine again if a loss of light is detected at the port in operation 408.

In some instances, determining a loss of light at an input port of the WSS 104, 106 may include the controller 108 comparing the sensor signal from the photodetector connected to the common input port 224 to the sensor signals received from the photodetectors 242 associated with the input ports 202-216. A loss of light may be determined if the sensor signals from the compared photodetectors 242 is different. In this example, a loss of the common input signal may not necessarily trigger an alarm as the common input signal loss would be detected at the common input port 224 and the input ports 202-216 simultaneously. Rather, the alarm condition may be triggered when the common input signal is detected at the common input port 224 but not at one or more of the input ports 202-216, indicating a removal of the loopback 502 from the detected port.

The loopback 502 at each unused port provides the common input signal to the corresponding photodetectors 242 such that the photodetectors 242 may detect when the loopback 502 is removed and light signal is no longer present at the input port. If a loss of light is detected in operation 408, the controller 108 may generate an alarm condition for the affected port in operation 412. Further, the controller 108 may transmit an indication of the alarm condition to the alarm monitoring system 112 via a network 110. The alarm monitoring system 112 may be any computing device or network associated with the ROADM 102 for monitoring alarms generated by the ROADM 102. In some instances, the alarm monitoring system 112 may monitor alarms for several network devices and may be associated with a network operational center. The alarm monitoring system 112 may generate one or more alerts to network engineers or administrators in response to receiving the alarm condition. The generated alarm indication may include information associated with the ROADM 102, such as an identification of the device, an identification of the alarm type, an identification of the particular port associated with the alarm, a location of the device 102, and the like.

In operation 414, the controller 108 may determine the cause of the alarm condition at the affected port. For example, the alarm monitoring system 112 may generate an alert to a network or device administrator to investigate the cause of the generated alarm. This may include dispatching a technician to the device 102 to determine if a network capture device was connected to the port in which an alarm was generated. In some instances, the loss of light alarm at the port may be the result of an accidental removal of the loopback 502 or some network outage at the port. In other instances, however, the alarm may be triggered by the connection of a nefarious device to the port. As long as the alarm cause is not verified or investigated, the controller 108 may maintain the alarm condition for the port in operation 416. However, after verification or investigation of the alarm cause, the alarm condition for the port may be reset in operation 418 and the controller 108 may return to monitoring the photodetectors 242 of the WSS 104, 106 of the ROADM 102 in operation 406 by setting the security alarm for the unused ports of the WSS 104, 106. In one example, resetting of the alarm may be in response to a command provided to the controller 108 from the alarm monitoring system 112 via the network 110. In another example, the alarm condition may be cleared at the ROADM 102 device by accessing the controller 108.

In addition to the photodetectors 242, the ports of the WSS 104, 106 may also include one or more physical sensors to detect the insertion of a cable or device into the port. For example, a mechanical switch may be connected to or otherwise associated with each port of the WSS 104, 106 that activates when a device or cable is inserted into the port. Each switch may transmit a signal to the controller 108 that indicates a position of the respective switch. The controller 108 may determine, based on the signals provided by the mechanical switches, which ports have a cable or device plugged into the port. For ports that are designated as "unused" or "unconnected", a signal from the switch indicating that a device is connected to the port may cause the controller 108 to generate an alarm. In some instances, the controller 108 may utilize the switch sensor indicator to verify the photodetector 242 input, override the photodetector 242 input, or generate an alarm regardless of the photodetector 242 input.

Additional security features may also be included in the ROADM 102 or WSS 104, 106 of the ROADM. For example, the controller 108 may configure one or more attenuation levels of the unused ports of the WSS 104, 106. In one instance, the attenuation level of the unused ports may be increased by the controller 108 such that a transmission signal is no longer transmitted from the output portion of the ports. In another instance, a noise signal may be applied to the input portion of each port of the WSS 104, 106 to fill up the spectrum at the port. In this instance, loopbacks 502 may not be used as the noise generating devices 504 are inserted into the input portion of the ports. To accommodate for the lack of loopbacks 502, a photodetector 242 may then be applied or inserted at the output portion of the port and provide a detection signal to the controller 108. Removal of the photodetector 242 at the output port would generate the alarm as described above. In general, the above methods and systems apply any networking device in which an input signal is replicated on one or more unused ports, causing a potential security vulnerability to the networking device.

Figure 6:
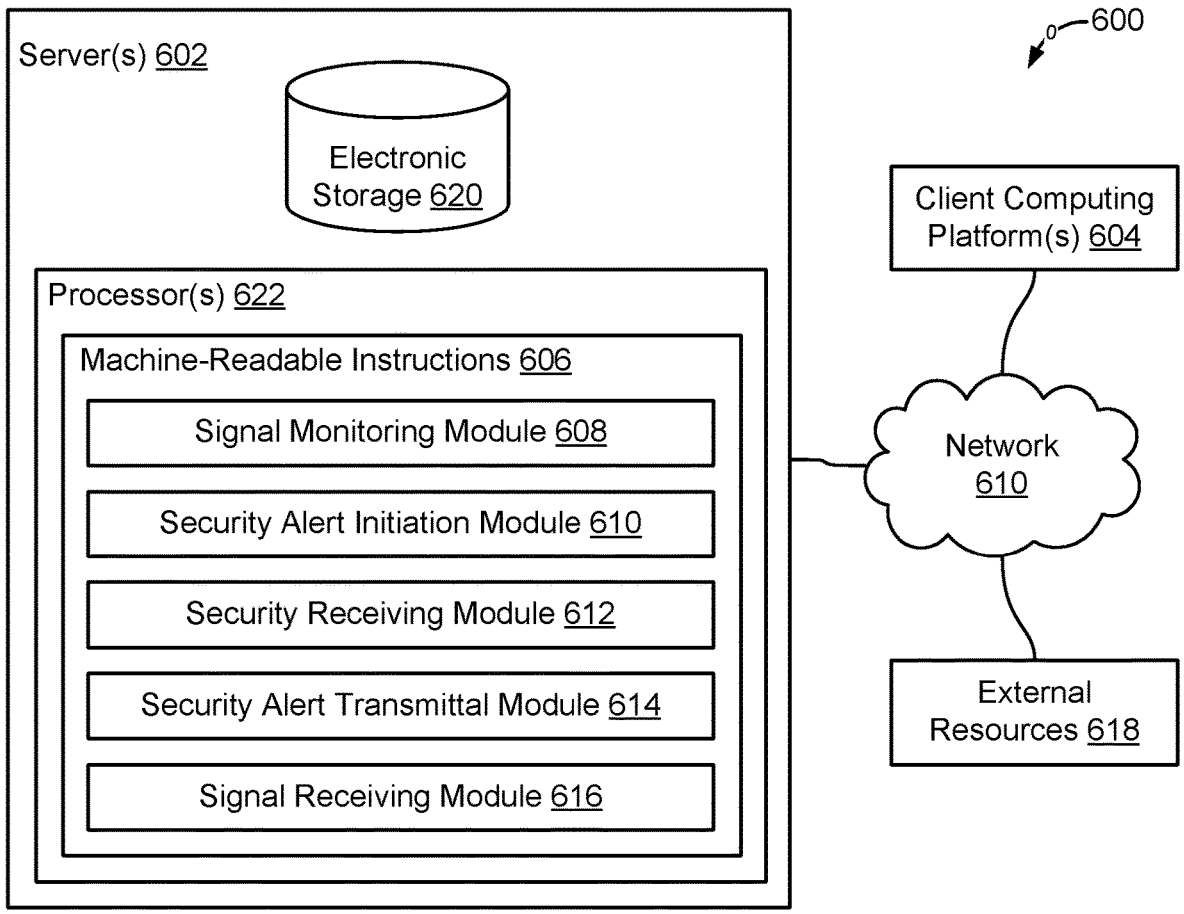
FIG. 6 is a schematic diagram illustrating an exemplary controller of a networking device implementing one or more security features in the device, in accordance with one or more implementations.

FIG. 6 illustrates a system 600 configured for detecting a security intrusion of a network device 102, in accordance with one or more implementations. In some implementations, system 600 may include one or more servers 604 in communication with at least one ROADM 102 or other networking device. The ROADM 102 may be configured to communicate with the server computing platforms 604 according to a client/server architecture and/or other architectures. The ROADM 102 may be configured with machine-readable instructions 106 that include one or more instruction modules. The instruction modules may include computer program modules. The instruction modules may include one or more of a signal monitoring module 608, a security alert initiation module 610, a security receiving module 612, a security alert transmittal module 614, a signal receiving module 616, and/or other instruction modules.

Security alert initiation module 610 may be configured to, in response to detecting a change in the light signal, initiate a security alert. A security receiving module 612 may be configured to, at the processor, receive a security setting for the port for the security enabling, the security setting indicative of the presence of the loopback connector in the port. Generally speaking, remotely or by connecting a service terminal or computer to the network device (e.g., ROADM), a configuration module of the ROADM 102 may be accessed and any port intended to be looped-back (security enable) configured or set as such. The security setting security may enable the monitoring of the change in light signal on the port of the networking device 102. The security enabled port may include a loopback connector 502 that redirects the light signal, as described. The removal of such loopback connector 502 may cause the change in the light signal. More particularly, the light signal may be redirected by the loopback connector 502 for detection by a photodetector 242 coupled with the security enabled port. The removal of the loopback connector 502 may cause the change in the light signal and the initiating of the security alert. So, by security enabling the port, the processor detects light changes associated with the port when the loop back connector is removed.

Security alert transmittal module 614 may be configured to transmit the security alert over a network. For example, the server 604 may be part of a network operations center and be running a monitoring program. The security alert may be received and flagged at the server. The signal may include some identification of the device initiating the signal, and may also include port information and the like. In some instances, personnel may then initiate a manual review of the device, and removal of any nefarious hardware or otherwise correction of any problem associated with the device triggering the security alert. Alternatively, the monitoring program may generate a signal, for receipt by a signal receiving module 616 configured to receive a signal to disable the networking device. The initiation of such a signal may be automatic or responsive to a user command entered at the monitoring device.

In some implementations, the server(s) 604 and networking devices 102 may be operatively linked via one or more electronic communication links. For example, such electronic communication links may be established, at least in part, via a network such as the Internet and/or other networks. It will be appreciated that this is not intended to be limiting, and that the scope of this disclosure includes implementations in which networking devices 102, server(s) 604, and/or external resources 618 may be operatively linked via some other communication media.

A given server computing platform 604 may include one or more processors configured to execute computer program modules. The computer program modules may be configured to enable an expert or user associated with the given computing platform 604 to interface with the system 600 and/or external resources 618, and/or provide other functionality attributed herein to the server platform(s) 604. By way of non-limiting example, the server computing platform 604 may include one or more of a server may be implemented by any number of possible computing platforms, including some level of virtualization, and may be include a blade device, a desktop computer, a laptop computer, a handheld computer, a tablet computing platform, a and/or other computing platforms.

External resources 618 may include sources of information outside of system 600, external entities participating with system 600, and/or other resources. In some implementations, some or all of the functionality attributed herein to external resources 618 may be provided by resources included in system 600. The network device 602 may include electronic storage 620, one or more processors 622, and/or other components. The network device 602 may include communication lines, or ports to enable the exchange of information with a network and/or other computing platforms. The network device 602 may include a plurality of hardware, software, and/or firmware components operating together to provide the functionality attributed herein to the security enabling a network device.

It should be appreciated that although modules 608, 610, 612, 614, and/or 616 are illustrated in FIG. 6 as being implemented within a single processing unit, in implementations in which processor(s) 622 includes multiple processing units, one or more of modules 608, 610, 612, 614, and/or 616 may be implemented remotely from the other modules. The description of the functionality provided by the different modules 608, 610, 612, 614, and/or 616 described below is for illustrative purposes, and is not intended to be limiting, as any of modules 608, 610, 612, 614, and/or 616 may provide more or less functionality than is described. For example, one or more of modules 608, 610, 612, 614, and/or 616 may be eliminated, and some or all of its functionality may be provided by other ones of modules 608, 610, 612, 614, and/or 616. As another example, processor(s) 622 may be configured to execute one or more additional modules that may perform some or all of the functionality attributed below to one of modules 608, 610, 612, 614, and/or 616.

Figure 7:
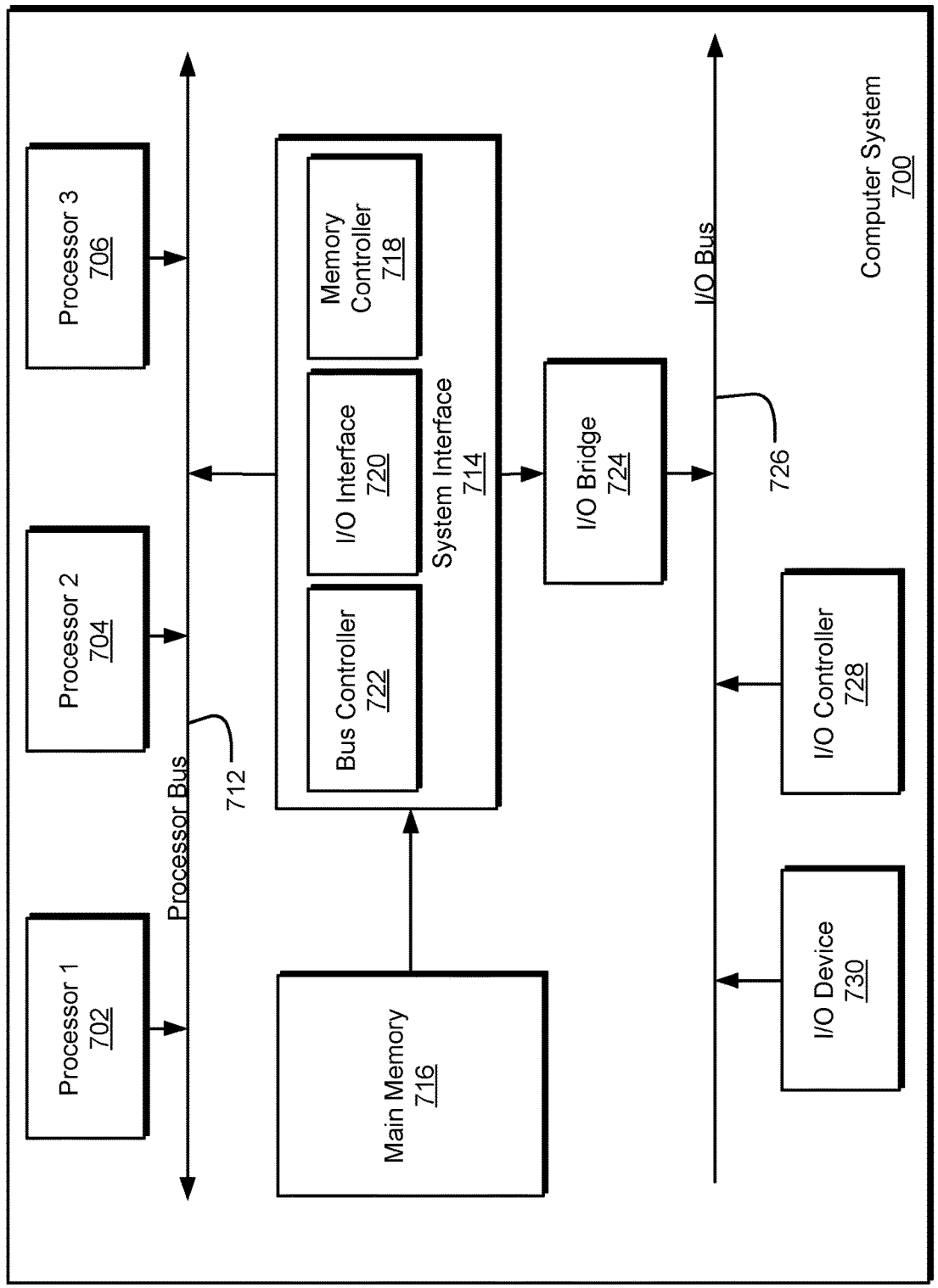
FIG. 7 is a diagram illustrating an example of a computing system which may be used in implementing embodiments of the present disclosure.

FIG. 7 is a block diagram illustrating an example of a computing device or computer system 700 which may be used in implementing the embodiments of the components of the network disclosed above. For example, the computing system 700 of FIG. 7 may be the controller 108 discussed above. The computer system (system) includes one or more processors 702-706. Processors 702-706 may include one or more internal levels of cache (not shown) and a bus controller or bus interface unit to direct interaction with the processor bus 712. Processor bus 712, also known as the host bus or the front side bus, may be used to couple the processors 702-706 with the system interface 714. System interface 714 may be connected to the processor bus 712 to interface other components of the system 700 with the processor bus 712. For example, system interface 714 may include a memory controller 714 for interfacing a main memory 716 with the processor bus 712. The main memory 716 typically includes one or more memory cards and a control circuit (not shown). System interface 714 may also include an input/output (I/O) interface 720 to interface one or more I/O bridges or I/O devices with the processor bus 712. One or more I/O controllers and/or I/O devices may be connected with the I/O bus 726, such as I/O controller 728 and I/O device 730, as illustrated.

I/O device 730 may also include an input device (not shown), such as an alphanumeric input device, including alphanumeric and other keys for communicating information and/or command selections to the processors 702-706. Another type of user input device includes cursor control, such as a mouse, a trackball, or cursor direction keys for communicating direction information and command selections to the processors 702-706 and for controlling cursor movement on the display device.

System 700 may include a dynamic storage device, referred to as main memory 716, or a random access memory (RAM) or other computer-readable devices coupled to the processor bus 712 for storing information and instructions to be executed by the processors 702-706. Main memory 716 also may be used for storing temporary variables or other intermediate information during execution of instructions by the processors 702-706. System 800 may include a read only memory (ROM) and/or other static storage device coupled to the processor bus 712 for storing static information and instructions for the processors 702-706. The system set forth in FIG. 7 is but one possible example of a computer system that may employ or be configured in accordance with aspects of the present disclosure.

According to one embodiment, the above techniques may be performed by computer system 700 in response to processor 704 executing one or more sequences of one or more instructions contained in main memory 716. These instructions may be read into main memory 716 from another machine-readable medium, such as a storage device. Execution of the sequences of instructions contained in main memory 716 may cause processors 702-706 to perform the process steps described herein. In alternative embodiments, circuitry may be used in place of or in combination with the software instructions. Thus, embodiments of the present disclosure may include both hardware and software components.

A machine readable medium includes any mechanism for storing or transmitting information in a form (e.g., software, processing application) readable by a machine (e.g., a computer). Such media may take the form of, but is not limited to, non-volatile media and volatile media and may include removable data storage media, non-removable data storage media, and/or external storage devices made available via a wired or wireless network architecture with such computer program products, including one or more database management products, web server products, application server products, and/or other additional software components. Examples of removable data storage media include Compact Disc Read-Only Memory (CD-ROM), Digital Versatile Disc Read-Only Memory (DVD-ROM), magneto-optical disks, flash drives, and the like. Examples of non-removable data storage media include internal magnetic hard disks, SSDs, and the like. The one or more memory devices 606 may include volatile memory (e.g., dynamic random access memory (DRAM), static random access memory (SRAM), etc.) and/or non-volatile memory (e.g., read-only memory (ROM), flash memory, etc.).

Computer program products containing mechanisms to effectuate the systems and methods in accordance with the presently described technology may reside in main memory 716, which may be referred to as machine-readable media. It will be appreciated that machine-readable media may include any tangible non-transitory medium that is capable of storing or encoding instructions to perform any one or more of the operations of the present disclosure for execution by a machine or that is capable of storing or encoding data structures and/or modules utilized by or associated with such instructions. Machine-readable media may include a single medium or multiple media (e.g., a centralized or distributed database, and/or associated caches and servers) that store the one or more executable instructions or data structures.

Embodiments of the present disclosure include various steps, which are described in this specification. The steps may be performed by hardware components or may be embodied in machine-executable instructions, which may be used to cause a general-purpose or special-purpose processor programmed with the instructions to perform the steps. Alternatively, the steps may be performed by a combination of hardware, software and/or firmware.

Although the present technology has been described in detail for the purpose of illustration based on what is currently considered to be the most practical and preferred implementations, it is to be understood that such detail is solely for that purpose and that the technology is not limited to the disclosed implementations, but, on the contrary, is intended to cover modifications and equivalent arrangements that are within the spirit and scope of the appended claims. For example, it is to be understood that the present technology contemplates that, to the extent possible, one or more features of any implementation can be combined with one or more features of any other implementation.

What is claimed is:

1. A network security device comprising:
   a plurality of bi-directional communication ports each comprising an output port and a corresponding input port;
   a loopback connector to redirect a light signal from an output port of at least one of the plurality of bi-directional communication ports to a corresponding input port of the at least one of the plurality of bi-directional communication ports;
   a controller configuring the at least one of the plurality of bi-directional communication ports as a security enabled port, the controller transmitting, to a security monitoring system, an alarm indication in response to detecting a loss of the redirected light signal on the security enabled ports; and
   a switch device associated with the at least one of the plurality of bi-directional communication ports and transmitting, to the controller, an insertion signal upon a change of state of the switch device in response to an insertion of a cable into the at least one of the plurality of bi-directional communication ports, wherein
   transmission of the alarm indication is further in response to receiving, at the controller, the insertion signal from the switch device associated with the security enabled port.

2. The network security device of claim 1 wherein the network device further comprises a photodetector associated with the at least one of the plurality of bi-directional communication ports and transmitting, to the controller, an indicator signal corresponding to a detection of the light signal on the input port.

3. The network security device of claim 2 wherein the photodetector detects a removal of the loopback connector and transmits, in response to the removal of the loopback connector, a loss of signal indicator to the controller.

4. The network security device of claim 1 wherein the network device is a reconfigurable optical add drop multiplexor (ROADM) and the photodetector is a photodiode.

5. The network security device of claim 4 wherein the plurality of bi-directional communication ports are operably associated with a wavelength selectable switch component of the ROADM.

6. The network security device of claim 2, the network device further comprising:
   a common signal bi-directional port comprise a common signal port receiving a common light signal; and
   a demultiplexer replicating the common light signal to the output port of each of the plurality of bi-directional communication ports.

7. The network security device of claim 6, the network device further comprising a light-detecting sensor associated with the common signal bi-directional port and transmitting, to the controller, a common signal indicator signal, wherein the controller further compares the indicator signal corresponding to the detection of the light signal on the input port and the common signal indicator signal.

8. The network security device of claim 1 wherein the at least one of the plurality of bi-directional communication ports is not providing communication with another networking device.

9. A method for detecting a security intrusion of a network device, the method comprising:
   redirecting, at a networking device, a light signal present on an output portion of at least one of a plurality of bi-directional communication ports of the networking device to a corresponding input portion of the at least one of the plurality of bi-directional communication ports;
   monitoring, via a controller, a presence of the light signal on the input portion of the at least one bi-directional communication port;
   configuring, at the controller, the at least one of the plurality of bi-directional communication ports as a security enabled port;
   transmitting, via the controller, a security alarm in response to detecting a loss of light signal on the input portion of the security enabled port; and
   transmitting, via a switch device associated with the at least one of the plurality of bi-directional communication ports, an insertion signal upon a change of state of the switch device in response to an insertion of a cable into the at least one of the plurality of bi-directional communication ports, wherein
   transmission of the security alarm is further in response to receiving, at the controller, the insertion signal from the switch device associated with the security enabled port.

10. The method of claim 9 wherein the networking device is a reconfigurable optical add drop multiplexor (ROADM) network device, the communication port associated with a wavelength selectable switch (WSS) of the ROADM network device.

11. The method of claim 9 wherein the networking device comprises a loopback connector between the output portion of the bi-directional communication port and the corresponding input portion of the communication port to redirect the light signal.

12. The method of claim 9 wherein monitoring the presence of the light signal comprises:
receiving, from a photodetector sensor corresponding to the input portion of the communication port, a light detection signal indicating the presence of the light signal, wherein transmission of the security alarm corresponds to the light detection signal indicating a loss of the light signal on the input portion of communication port.

13. The method of claim 9 further comprising:
configuring, via the controller, a first portion of a plurality of communication ports of the networking device as transmission ports for communication with other networking devices; and
configuring, via the controller, a second portion of the plurality of communication ports of the networking device as security ports, the bi-directional communication ports included in the second portion of the plurality of communication ports, the security ports monitored for a loss of the light signal.

14. The method of claim 13 wherein an input light signal is replicated to each of the plurality of communication ports of the networking device.

15. A networking device comprising:
a network communication port receiving a telecommunications signal;
a wavelength selectable switch (WSS) replicating the telecommunications signal on a plurality of bi-directional communication ports each comprising an output port and a corresponding input port;
a loopback connector to redirect a light signal from an output port of at least one port of the plurality of bi-directional communication ports to a corresponding input port of the at least one port;
a photodetector associated with the at least one port to detect a light signal on the input port of the at least one port;
the controller receiving a light detection signal from the photodetector and generating, based on the light detection signal, a security alarm for the security enabled port; and
a switch device associated with the at least one of the plurality of bi-directional communication ports and transmitting, to the controller, an insertion signal upon a change of state of the switch device in response to an insertion of a cable into the at least one of the plurality of bi-directional communication ports, wherein
generation of the security alarm is further in response to receiving, at the controller, the insertion signal from the switch device associated with the security enabled port.

16. The networking device of claim 15 further comprising:
a switch associated with the at least one port and transmitting, to the controller, an insertion signal in response to an insertion of a device into the at least one port.

17. The networking device of claim 15 wherein the light detection signal indicates a loss of the light signal at the input port of the at least one port.

18. The networking device of claim 15 wherein a second port of the plurality of bi-directional communication ports other than the at least one port is connected to another networking device, the controller disregarding a light detection signal associated with the second port.

* * * * *